(12) United States Patent
Burak et al.

(10) Patent No.: US 8,330,325 B1
(45) Date of Patent: Dec. 11, 2012

(54) BULK ACOUSTIC RESONATOR COMPRISING NON-PIEZOELECTRIC LAYER

(75) Inventors: Dariusz Burak, Fort Collins, CO (US); Jyrki Kaitila, Riemerling (DE); Alexandre Shirakawa, San Jose, CA (US); Martin Handtmann, Munich (DE); Phil Nikkel, Loveland, CO (US)

(73) Assignee: Avago Technologies Wireless IP (Singapore) Pte. Ltd., Singapore (SG)

(*) Notice: Subject to any disclaimer, the term of this patent is extended or adjusted under 35 U.S.C. 154(b) by 0 days.

(21) Appl. No.: 13/161,946

(22) Filed: Jun. 16, 2011

(51) Int. Cl.
 *H03H 9/15* (2006.01)
 *H03H 9/125* (2006.01)
(52) U.S. Cl. .................. 310/320; 310/321; 333/187
(58) Field of Classification Search .......... 310/320, 310/321, 365; 333/187
See application file for complete search history.

(56) References Cited

U.S. PATENT DOCUMENTS

| | | | |
|---|---|---|---|
| 4,975,892 A | 12/1990 | Defranould et al. | |
| 5,587,620 A | 12/1996 | Ruby et al. | |
| 5,873,153 A | 2/1999 | Ruby et al. | |
| 6,060,818 A | 5/2000 | Ruby et al. | |
| 6,107,721 A | 8/2000 | Lakin | |
| 6,150,703 A | 11/2000 | Cushman et al. | |
| 6,396,200 B2 | 5/2002 | Misu et al. | |
| 6,507,983 B1 | 1/2003 | Ruby et al. | |
| 6,617,751 B2 | 9/2003 | Sunwoo et al. | |
| 6,820,469 B1 | 11/2004 | Adkins et al. | |
| 6,941,036 B2 | 9/2005 | Lucero | |
| 6,985,051 B2 | 1/2006 | Nguyen et al. | |
| 7,129,806 B2 | 10/2006 | Sato | |
| 7,179,392 B2 | 2/2007 | Robert et al. | |
| 7,233,218 B2 | 6/2007 | Park et al. | |
| 7,280,007 B2 | 10/2007 | Feng et al. | |
| 7,345,410 B2 | 3/2008 | Grannen et al. | |
| 7,358,831 B2 | 4/2008 | Larson et al. | |
| 7,388,454 B2 | 6/2008 | Ruby et al. | |
| 7,508,286 B2 | 3/2009 | Ruby et al. | |
| 7,576,471 B1 | 8/2009 | Solal | |
| 7,629,865 B2 | 12/2009 | Ruby | |
| 7,768,364 B2 | 8/2010 | Hart et al. | |
| 7,795,781 B2 | 9/2010 | Barber et al. | |
| 7,869,187 B2 * | 1/2011 | McKinzie, III | 361/303 |
| 7,889,024 B2 | 2/2011 | Bradley et al. | |
| 7,978,025 B2 * | 7/2011 | Yokoyama et al. | 333/133 |
| 2001/0045793 A1 | 11/2001 | Misu et al. | |
| 2004/0027216 A1 * | 2/2004 | Ma et al. | 333/187 |

(Continued)

FOREIGN PATENT DOCUMENTS

| | | | |
|---|---|---|---|
| EP | 2299593 | | 3/2011 |
| JP | 61-65507 A | * | 4/1986 |
| JP | 2003017964 | | 1/2003 |
| JP | 2007/028669 | | 2/2007 |

OTHER PUBLICATIONS

Bi, F.Z., "Bulk Acoustic Wave RF Technology", *IEEE Microwave Magazine*, vol. 9, Issue 5. 2008, 65-80.

(Continued)

*Primary Examiner* — Thomas Dougherty

(57) ABSTRACT

In a representative embodiment, a bulk acoustic wave (BAW) resonator structure comprises: a first electrode disposed over a substrate; a first piezoelectric layer disposed over the first electrode; a second electrode disposed over the first piezoelectric layer, wherein c-axis orientations of crystals of the first piezoelectric layer are substantially aligned with one another; a second piezoelectric layer disposed over the second electrode; a non-piezoelectric layer; and a third electrode disposed over the second piezoelectric layer.

19 Claims, 9 Drawing Sheets

U.S. PATENT DOCUMENTS

| | | | |
|---|---|---|---|
| 2004/0195937 | A1 | 10/2004 | Matsubara et al. |
| 2005/0206479 | A1 | 9/2005 | Nguyen et al. |
| 2005/0269904 | A1 | 12/2005 | Oka |
| 2006/0017352 | A1 | 1/2006 | Tanielian |
| 2006/0114541 | A1* | 6/2006 | Van Beek ............ 359/224 |
| 2006/0176126 | A1* | 8/2006 | Wang et al. ............ 333/187 |
| 2006/0284706 | A1* | 12/2006 | Ginsburg et al. ............ 333/187 |
| 2007/0085632 | A1* | 4/2007 | Larson et al. ............ 333/187 |
| 2007/0205850 | A1 | 9/2007 | Jamneala et al. |
| 2009/0127978 | A1 | 5/2009 | Asai et al. |
| 2009/0153268 | A1 | 6/2009 | Milson et al. |
| 2010/0052815 | A1 | 3/2010 | Bradley et al. |
| 2010/0091370 | A1 | 4/2010 | Mahrt et al. |
| 2010/0148637 | A1 | 6/2010 | Satou |
| 2010/0187948 | A1 | 7/2010 | Sinha et al. |
| 2010/0260453 | A1 | 10/2010 | Block |
| 2010/0327697 | A1 | 12/2010 | Choy et al. |
| 2010/0327994 | A1 | 12/2010 | Choy et al. |
| 2011/0121916 | A1 | 5/2011 | Barber et al. |
| 2012/0161902 | A1 | 6/2012 | Feng et al. |
| 2012/0194297 | A1 | 8/2012 | Choy |

OTHER PUBLICATIONS

Lee, Jiunn-Homg et al., "Optimization of Frame-Like Film Bulk Acoustic Resonators for Supression of Spurious Lateral Modes Using Finite Element Method", *IEEE Ultrasonic Symposium*, vol. 1, 2004, 278-281.

Martinez, et al., "High confinement suspended micro-ring resonators in silicon-on-insulator", *Optics Express*, Vo. 14, No. 13 Jun. 26, 2006, 6259-6263.

Pandey, et al., "Anchor Loss Reduction in Resonant MEMS using MESA Structures", *Proceedings of the 2nd IEEE International Conference on Nano/Micro Engineered and Molecular Systems*, Bangkok, Thailand Jan. 16-19, 2007, 880-885.

Tas, et al., "Reducing Anchor Loss in Micromechanical Extensional Mode Resonators", *IEEE Transactions on Ultrasonics, Ferroelectrics and Frequency Control*, vol. 57, No. 2. Feb. 2010, 448-454.

Pensala, et al. "Spurious resonance suppression in gigahertz-range ZnO thin-film bulk acoustic wave resonators by the boundary frame method: modeling and experiment," IEEE Transactions on Ultrasonics, Ferroelectrics, and Frequency Control, vol. 56, No. 8, Aug. 2009, p. 1731-1744.

Pensala, "Thin film bulk acoustic wave devices: performance optimization and modeling," http://www.vtt.fi/inf/pdf/publications/2011/P756.pdf.

Co-pending U.S. Appl. No. 13/074,094, filed Mar. 29, 2011.
Co-pending U.S. Appl. No. 13/036,489, filed Feb. 28, 2011.
Co-pending U.S. Appl. No. 13/074,262, filed Mar. 29, 2011.
Co-pending U.S. Appl. No. 13/101,376, filed May 5, 2011.
Co-pending U.S. Appl. No. 12/710,640, filed Feb. 23, 2010.

* cited by examiner

BULK ACOUSTIC RESONATOR COMPRISING NON-PIEZOELECTRIC LAYER

BACKGROUND

Transducers generally convert electrical signals to mechanical signals or vibrations, and/or mechanical signals or vibrations to electrical signals. Acoustic transducers, in particular, convert electrical signals to acoustic waves and acoustic waves to electrical signals using inverse and direct piezoelectric effects. Acoustic transducers generally include acoustic resonators, such as thin film bulk acoustic resonators (FBARs), surface acoustic wave (SAW) resonators or bulk acoustic wave (BAW) resonators, and may be used in a wide variety of electronic applications, such as cellular telephones, personal digital assistants (PDAs), electronic gaming devices, laptop computers and other portable communications devices. For example, FBARs may be used for electrical filters and voltage transformers. Generally, an acoustic resonator has a layer of piezoelectric material between two conductive plates (electrodes), which may be formed on a thin membrane. FBAR devices, in particular, generate acoustic waves that can propagate in lateral directions when stimulated by an applied time-varying electric field, as well as higher order harmonic mixing products. The laterally propagating modes and the higher order harmonic mixing products may have a deleterious impact on functionality.

What is needed, therefore, is a structure useful in mitigating acoustic losses at the boundaries of the BAW resonator to improve mode confinement in the region of overlap of the top electrode, the piezoelectric layer, and the bottom electrode of a BAW resonator (commonly referred to as the active region).

SUMMARY

In accordance with a representative embodiment, a bulk acoustic wave (BAW) resonator structure, comprises: a first electrode disposed over a substrate; a piezoelectric layer disposed over the first electrode; a second electrode disposed over the first piezoelectric layer, wherein c-axis orientations of crystals of the piezoelectric layer are substantially aligned with one another; and a non-piezoelectric layer disposed over the first electrode and adjacent to the piezoelectric layer, wherein an overlap of the non-piezoelectric layer with the second electrode has a width substantially equal to an integer multiple of one-quarter wavelength of a first propagating eigenmode in the non-piezoelectric layer, or greater than or equal to an inverse of an attenuation constant (1/k) of a first evanescent eigenmode in the non-piezoelectric layer.

In accordance with another representative embodiment, a bulk acoustic wave (BAW) resonator structure, comprises a first electrode disposed over a substrate; a first piezoelectric layer disposed over the first electrode; a second electrode disposed over the first piezoelectric layer, wherein c-axis orientations of crystals of the first piezoelectric layer are substantially aligned with one another; a second piezoelectric layer disposed over the second electrode; a non-piezoelectric layer; and a third electrode disposed over the second piezoelectric layer.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
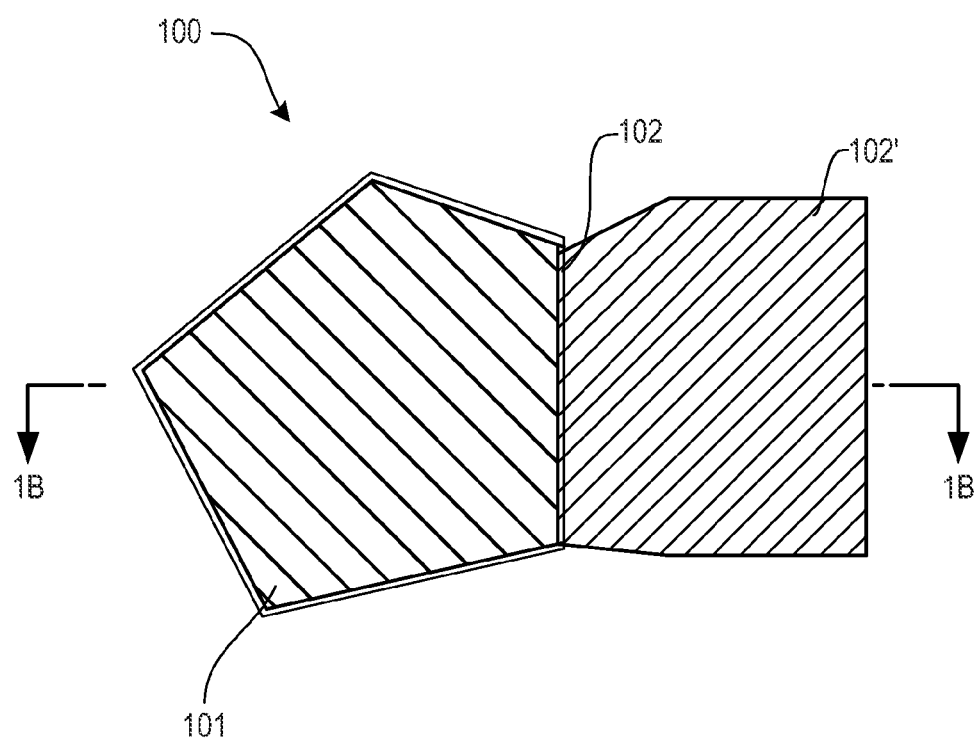
FIG. 1A shows a top-view of an FBAR in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom,"

"upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate generally to bulk acoustic wave (BAW) resonator structures comprising FBARs, double bulk acoustic resonators (DBARs) and coupled resonator filters (CRFs). As will be described more fully below, the FBARs, DBARs and CRFs of the representative embodiments comprise a layer of piezoelectric (p) material disposed between electrodes and a layer of non-piezoelectric (np) material disposed adjacent to the layer of piezoelectric material. The crystals of the layer of piezoelectric material grow in columns that are perpendicular to the plane of the electrodes. As such, the c-axis orientations of crystals of the layer of piezoelectric material are substantially aligned with one another and the layer of piezoelectric material may be referred to as a highly-textured c-axis piezoelectric layer. Such a layer of piezoelectric material may be fabricated according to one of a variety of known methods, such as disclosed in U.S. Pat. No. 6,060,818, to Ruby, et al., the disclosure of which is specifically incorporated herein by reference. The layer of non-piezoelectric layer is typically made from the same substance as the layer of piezoelectric material, but is either amorphous or polycrystalline and exhibits little or no piezoelectric effects because of crystal growth in a variety of directions. The layer of non-piezoelectric material may be fabricated by methods described below or according to the teachings of U.S. Pat. No. 7,795,781 to Barber, et al., the disclosure of which is specifically incorporated herein by reference.

Acoustic resonators, and particularly FBARs, can be employed in a variety of configurations for RF and microwave devices such as filters and oscillators operating in a variety of frequency bands. For use in mobile communication devices, one particular example of a frequency band of interest is the 850 MHz "cellular band." In general, the size of a BAW resonator increases with decreasing frequency such that an FBAR for the 850 MHz band will be substantially larger than a similar FBAR for the 2 GHz personal communication services (PCS) band. Meanwhile, in view of continuing trends to miniaturize components of mobile communication device, it may be conceptually imagined that a BAW resonator having a relatively large size may be cut in half, and the two halves, each of which may be considered to be a smaller acoustic resonator, may be stacked upon one another. An example of such a stacked BAW resonator is a DBAR. In certain applications, the BAW resonator structures provide DBAR-based filters (e.g., ladder filters).

A CRF comprises a coupling structure disposed between two vertically stacked FBARs. The CRF combines the acoustic action of the two FBARs and provides a bandpass filter transfer function. For a given acoustic stack, the CRF has two fundamental resonance modes, a symmetric mode and an anti-symmetric mode, of different frequencies. The degree of difference in the frequencies of the modes depends, inter alia, on the degree or strength of the coupling between the two FBARs of the CRF. If the degree of coupling between the two FBARs is too great (over-coupled), the passband is unacceptably wide, and an unacceptable 'swag' or 'dip' in the center of the passband results, as does an attendant unacceptably high insertion loss in the center of the passband. If the degree of coupling between the FBARs is too low (under-coupled), the passband of the CRF is too narrow.

Certain details of FBARs, DBARs, CRFs, materials thereof and their methods of fabrication may be found in one or more of the following commonly owned U.S. Patents, Patent Application Publications and Patent Applications: U.S. Pat. No. 6,107,721, to Lakin; U.S. Pat. Nos. 5,587,620, 5,873,153 and 6,507,983 to Ruby, et al.; U.S. Pat. No. 7,629, 865 to Ruby, et al.; U.S. Pat. No. 7,280,007 to Feng, et al.; U.S. Patent Application Publication No. 2007/0205850 to Jamneala, et al.; U.S. Pat. No. 7,388,454 to Richard C. Ruby, et al; U.S. Patent Application Publication No. 2010/0327697 to Choy, et al.; and U.S. Patent Application Publication No. 2010/0327994 to Choy, et al. Examples of DBARs and CRFs as well as their materials and methods of fabrication, may be found in U.S. Pat. No. 7,889,024 to Paul Bradley et al., U.S. patent application Ser. No. 13/074,094 of Shirakawa et al., and filed on Mar. 29, 2011, U.S. patent application Ser. No. 13/036,489 of Burak et al., and filed on Feb. 28, 2011, U.S. patent application Ser. No. 13/074,262 to Burak, et al. filed on Mar. 29, 2011, and U.S. patent application Ser. No. 13/101, 376 of Burak et al., and filed on May 5, 2011. The disclosures of these patents, patent application publications and patent applications are specifically incorporated herein by reference. It is emphasized that the components, materials and method of fabrication described in these patents and patent applications are representative and other methods of fabrication and materials within the purview of one of ordinary skill in the art are contemplated.

Embodiments Comprising an FBAR

FIG. 1A shows a top view of an FBAR 100 in accordance with a representative embodiment. The FBAR 100 comprises a top electrode 101 (referred to below as second electrode 101), illustratively comprising five (5) sides, with a connection side 102 configured to provide the electrical connection to an interconnect 102'. The interconnect 102' provides electrical signals to the top electrode 101 to excite desired acoustic waves in piezoelectric layers (not shown in FIG. 1) of the DBAR 100.

Figure 1B:
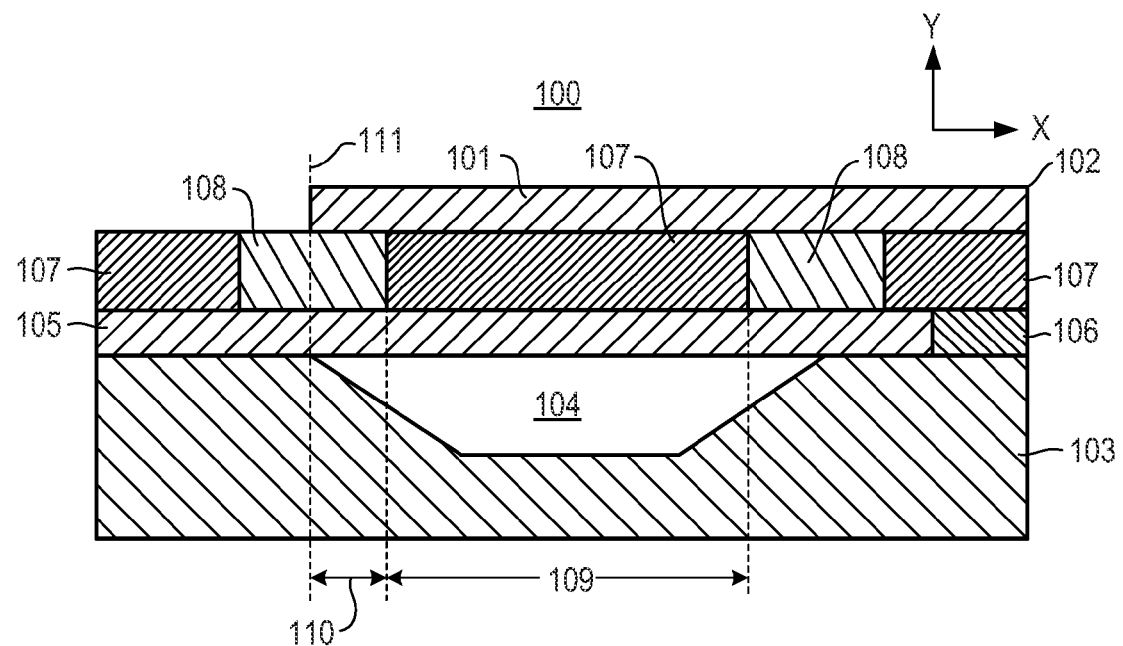
FIGS. 1B-1C are cross-sectional views of the FBAR of FIG. 1A, taken along the line 1B-1B.

FIG. 1B shows a cross-sectional view of FBAR 100 depicted in FIG. 1A and taken along the line 1B-1B. A substrate 103 comprises a cavity 104 or other acoustic reflector (e.g., a distributed Bragg grating (DBR) (not shown)). A first electrode 105 is disposed over the substrate 103 and is suspended over the cavity 104. A planarization layer 106 is provided over the substrate 103 and may be non-etchable borosilicate glass (NEBSG) In general, planarization layer 106 does not need to be present in the structure (as it increases overall processing cost), but when present, it may serve to improve the quality of growth of subsequent layers (e.g., highly textured c-axis piezoelectric material) and simplify their processing. A piezoelectric layer 107 is provided over the first electrode 105, and comprises highly-textured c-axis piezoelectric material such as aluminum nitride (AlN) or zinc oxide (ZnO). Adjacent to the piezoelectric layer 107 is non-piezoelectric (np) layer 108. The np layer 108 is typically made from the same substance as the piezoelectric layer 107 (e.g., AlN or ZnO) but is either amorphous or polycrystalline and exhibits little or no piezoelectric effects. The second electrode 101 is disposed over the piezoelectric layer 107 and over the np layer 108.

The overlap of the cavity 104, the first electrode 105, the piezoelectric layer 107, and the second electrode 101 defines an active region 109 of the FBAR 100. In representative embodiments described below, acoustic losses at the boundaries of FBAR 100 are mitigated to improve mode confinement in the active region 109. In particular, the width of an overlap 110 of the second electrode 101 and the np layer 108 is selected to reduce acoustic losses resulting from scattering of both continuous modes and a lowest order propagating eigenmode in the np layer at the edge 111 of second electrode 101. As described more fully below, the width of the overlap 110 is selected to be greater than or equal to the inverse of the attenuation constant (1/k) (where k is the attenuation constant of the lowest order evanescent mode ($e^{-kx}$)) in the np layer 108 and closely approximates the behavior of continuous modes. Alternatively, the width of the overlap 110 is selected to be an integer multiple (1, 2, 3, . . . ) of quarter-wavelength ($\lambda/4$) of the lowest order propagating eigenmode in the np layer 108.

At a series resonance frequency ($F_s$) of the FBAR 100, electrical energy is transferred to the acoustic energy and vice-versa. While the electric field (and thus electric energy density) is confined to the active region 109 under the second electrode 101, the acoustic field (and thus acoustic energy density) can be both confined to the region under the electrode (in the form of continuous modes) or can propagate away (in the form of a propagating eigenmode). The electric field profile is determined by the lateral shape of the second electrode 101, as typically the first electrode 105 extends beyond (in the x-z plane in the depicted coordinate system) the second electrode 101. Mathematically, lateral shape of the electrical field in the active region 109 can be represented as a Fourier superposition of plane waves propagating at different angles with respect to top or bottom interfaces of the piezoelectric layer 107 in FBAR 100. It should be emphasized that this is purely a mathematical concept, since there are no physical electric field waves propagating in the structure. In other words, spatial spectrum of the electric field is given by a Fourier transform on an electric field profile. Each spatial spectral component of the electric field excites an acoustic plane wave propagating at the same angle with respect to top or bottom interfaces of piezoelectric layer 107. Unlike the electric field, which is confined vertically by the presence of first and second electrodes 105, 101, the excited acoustic waves can propagate vertically through all the layers of FBAR 100. However, in general, electrically excited acoustic plane waves cannot propagate freely beyond the active region 109 of the FBAR 100 because of destructive interference of these acoustic plane waves upon the reflection from the interfaces. These non-propagating waves form a set of so-called continuous modes. The continuous modes decay exponentially in the direction away from the excitation region. In this case the excitation region is defined by an overlap of second electrode 101 enforcing electric field and piezoelectric layer 107. However, for some spatial spectral components of the electric field, the excited acoustic waves interfere constructively upon reflections from the interfaces of the layer stack that comprise the FBAR 100. These acoustic plane waves can propagate freely in the lateral direction (x-z plane) away from the active region 109, and are therefore called propagating eigenmodes of the FBAR 100. As such, if these propagating modes are not confined to the active region 109 or suppressed, deleterious loss of energy results. This loss of energy is manifest, for example, but reduced a quality factor (Q) in the FBAR 100.

The Fourier superposition of plane waves excited under the second electrode 101 can be mathematically represented as a superposition of contributions from complex poles corresponding to propagating and evanescent eigenmodes for a given stack. The evanescent eigenmodes generally cannot propagate in the stack and decay exponentially from the point of excitation. Such a decomposition can be generally performed for any forced system, where forcing happens either through electrical excitation (like under the second electrode 101) or through mechanical excitation. The mechanical excitation occurs, for example, at an interface between two regions (e.g. interface between piezoelectric layer 107 and np layer 108 of FBAR 100), where one region exhibits a known forcing motion, while the other region is passive and both regions are coupled through the continuity of stress and particle velocities at the interface between them.

In the FBAR 100, the active region 109 motion is electrically excited, whereas motion in the np layer 108 is mechanically excited and results from boundary conditions at the interface of the piezoelectric layer 107 and the np layer 108. The piezoelectric layer 107 and the np layer 108 are made of the same substance in order for these layers to be substantially elastically identical. Accordingly, their corresponding sets of propagating eigenmodes and evanescent eigenmodes will be also substantially identical. As a result, any propagating eigenmode excited in the piezoelectric layer 107 in the active region 109 will excite a corresponding propagating eigenmode of substantially equal amplitude in the np layer 108. Similarly, any evanescent eigenmode excited by the electric field in the piezoelectric layer 107 in the active region 109 will excite a corresponding evanescent mode of substantially equal amplitude in the np layer 108.

There is a significant difference in modal profiles between propagating and evanescent eigenmodes in the lateral direction (x-direction in the coordinate system shown in FIG. 1B). The modal profile is defined as a complex amplitude of particle displacement given as a function of lateral (x-direction) and vertical (y-direction) directions in the coordinate system shown in FIG. 1B. Propagating modes have a form of spatially periodic function, both in the active region 109 and in the np layer 108 outside of the active region 109. By contrast, evanescent modes have a constant profile (i.e., the displacement amplitude does not depend on x-direction) in the active region 109 and decay exponentially in the direction away from the interface of the piezoelectric layer 107 and the np layer 108. Moreover, for typical electrical excitation the lowest-order evanescent eigenmode contains a substantial portion (for example, ~50%) of the elastic energy compared to energy confined in other higher-order evanescent eigenmodes and in the propagating eigenmodes. However, this partitioning of energy between the various eigenmodes depends on frequency of excitation and on thicknesses and materials used in layers of FBAR 100. In accordance with certain illustrative embodiments, the width of the overlap 110 of the np layer 108 and the second electrode 101 is selected to be equal to or greater than or equal to the inverse of the attenuation constant (1/k) of the lowest order evanescent eigenmode in the np layer 109. As such, at the acoustic impedance discontinuity at an edge 111 of the second electrode 101, the lowest order evanescent mode will have decayed sufficiently to prevent energy loss due to scattering at this interface.

Propagating eigenmodes of the np layer 108 are mechanically excited at the interface of the piezoelectric layer 107 and the np layer 108 and will propagate towards the edge 111 of the second electrode 101. The edge 111 of the second electrode 101 presents a comparatively large acoustic impedance discontinuity for the propagating eigenmode, thus causing scattering and reflection of this eigenmode back to towards the active region 109. This backward propagating eigenmode will interfere with the propagating mode excited at the interface of the piezoelectric layer 107 and the np layer 108. Depending on the phase upon the reflection and on the width of the overlap 110 of the np layer 108 and the second electrode 101, the interference of the propagating eigenmode reflected at the edge 111 with the propagating eigenmode excited at the interface of the piezoelectric layer 107 and the np layer 108 can be either constructive or destructive. It is beneficial to suppress the propagating mode amplitude, in order to reduce the amount of energy that can possibly be lost to the propagating eigenmode beyond the edge 111.

It is noted that the above description is a single excitation point (e.g. at the interface between piezoelectric layer 107 and np layer 108 in FBAR 100) approximation to the complete case of the propagating eigenmode excitation problem, and is given only to facilitate basic appreciation for the effects arising from the wave nature of the case considered here. As noted above, the propagating eigenmodes are continuously excited in the entire active region 109 and as such form a diffraction pattern in the np layer 108. Moreover, this diffraction pattern is further complicated by the presence of large acoustic impedance discontinuity at edge 111. Typically, numerical analysis is required to compute and analyze the diffraction pattern formed in FBAR 100 comprising of piezoelectric layer 107, np layer 108 and edge 111. As described more fully below, improved FBAR 100 performance, resulting from suppressing of the diffraction pattern in np layer 108, occurs when the width of the overlap 110 of the second electrode 101 and the np layer 108 are at integer multiple (1, 2, 3, . . . ) of quarter-wavelength ($\lambda/4$) of the lowest order propagating eigenmode in the np layer 108. In order to foster this diffractive effect, in certain representative embodiments, the width of the overlap 110 of the second electrode 101 and the np layer 108 is selected to be an integer multiple (1, 2, 3, . . . ) of quarter-wavelength ($\lambda/4$) of the lowest order propagating eigenmode in the np layer 108. Because a significant portion of the energy of propagating eigenmodes in the np layer 108 is found in the first order propagating eigenmode, the largest amount of modal suppression can be achieved by fostering diffractive suppression of this mode in the np layer 108. In certain embodiments the greatest parallel impedance (Rp) and the highest Q is attained by selecting the width of the overlap 110 of the second electrode 101, and the np layer 108 is selected to be an integer multiple (1, 2, 3, . . . ) of quarter-wavelength ($\lambda/4$) of the lowest order propagating eigenmode in the np layer 108.

Illustratively, the substrate 103 comprises silicon and the cavity 104 is fabricated by etching the cavity 104 in the substrate 103 by a known method. A sacrificial layer (not shown) is provided in the cavity 104. Next, the first electrode 105 is formed over the substrate 103. Planarization layer 106 is also provided over the substrate 103 and serves to improve the quality of growth of subsequent layers (e.g., highly textured c-axis piezoelectric material) and simplify their processing.

After the first electrode 105 and planarization layer are provided, the piezoelectric layer 107 and the np layer 108 are formed over the substrate 103. An etch stop layer (e.g., AlN, not shown) is provided over the first electrode 105 and protects the first electrode 105. Next, according to an embodiment, a disruptive seed layer (not shown) is provided over the first electrode 105 and the planarization layer 106. For AlN the disruptive seed layer may be an oxide (e.g., carbon doped oxide (CDO) or silicon dioxide $SiO_2$) or silicon carbide (SiC). The disruptive seed layer is comparatively thin with thickness range between approximately 50 Å and approximately 500 Å and, as described below, serves to foster fabrication of np layer 108 comprising amorphous or polycrystalline material that exhibits little or no piezoelectric effects because of crystal growth in a variety of directions. For other piezoelectric materials (e.g. ZnO) removal of the seed layer, which is typically provided to improve the quality of subsequently grown piezoelectric material, may be required to foster the disoriented growth.

The disruptive seed layer is photo-patterned and removed except in regions above the first electrode 105 where the np layer 108 is desirably grown. Next, the etch stop layer is removed by a known method. Next, a material useful for the piezoelectric layer 107 is grown over the exposed first electrode 105 and the disruptive seed layer. In regions over the first electrode the growth results in highly textured c-axis piezoelectric material such as AlN or ZnO. However, in regions above the disruptive seed layer, material of the same substance as the piezoelectric layer 107 is formed, but the crystal growth is purposefully disoriented and an amorphous or polycrystalline layer forms the np layer 108.

Alternatively, rather than the use of a disruptive seed layer, a "top-down" method may be used to form the np layer 108. For example, after the first electrode 105 is formed, fabrication of highly textured c-axis piezoelectric material (e.g., AlN or ZnO) is commenced. After forming an initial piezoelectric layer having a thickness being a fraction of the final thickness of the np layer 108, the growth is interrupted and a mask is provided over the area of the piezoelectric layer grown thus far, except where it is desired to grow np layer 108. The initial layer thickness is typically selected to be in a range of 20% to 80% of the final thickness of np layer 108. Notably, if the initial layer is too thin, the layer subsequently grown may have piezoelectric properties, which is not desired of np layer 108. By contrast, if the initial layer is too thick, the piezoelectric properties of already grown material may dominate the properties of np layer 108. As such, the optimal initial layer thickness is determined experimentally. Next, an ion implantation step is carried out to reduce or destroy the crystallinity of the material in the unmasked region (i.e., where the np layer 108 is to be formed). In a representative embodiment, the ions used for ion implantation to disrupt crystalline growth to form the np layer may be oxygen ions, argon ions, boron ions, phosphorous ions or hydrogen ions. The ion implant is effected by known methods and may be carried out with a single energy and dose or multiple energies and doses. Illustratively, the energy of the ion implantation is in the range of approximately 150 keV to approximately 450 keV, and the doses are between approximately $1\times10^{14}/cm^2$ to approximately $1\times10^{16}/cm^2$. After the ion implantation is completed, the mask is removed, and deposition of the material continues. In the masked regions, piezoelectric layer 107 is formed, and in unmasked regions, the np layer 108 is formed. Notably, because a disruptive seed layer is not provided, piezoelectric layer 107 and the np layer 108 have substantially the same thickness, and their upper surfaces (over which the second electrode 101 is formed) are substantially coplanar.

The np layer 108 has a thickness (y-direction in the coordinate system of FIG. 1B) that is substantially identical to that of the piezoelectric layer, or slightly greater in thickness because of the added disruptive seed layer. As noted above, the np layer 108 exhibits little or no piezoelectric effects. In certain embodiments, the np layer 108 has a piezoelectric coupling coefficient ($e_{33np}$) that is less than the piezoelectric coupling coefficient ($e_{33p}$) of the piezoelectric layer. Illustratively, $e_{33np}$ is in the range of approximately $0.01\ e_{33p}$ to approximately $0.8\ e_{33p}$. As described above, a comparatively low $e_{33np}$ ensures poor coupling of the evanescent eigenmode in the np layer 108, improved propagating eigenmode confinement in the active region 109, and improved performance (e.g., Q-factor) of the FBAR 100.

After the piezoelectric layer 107 and the np layer 108 are formed, the second electrode 101 is formed thereover to complete the FBAR.

Figure 1C:
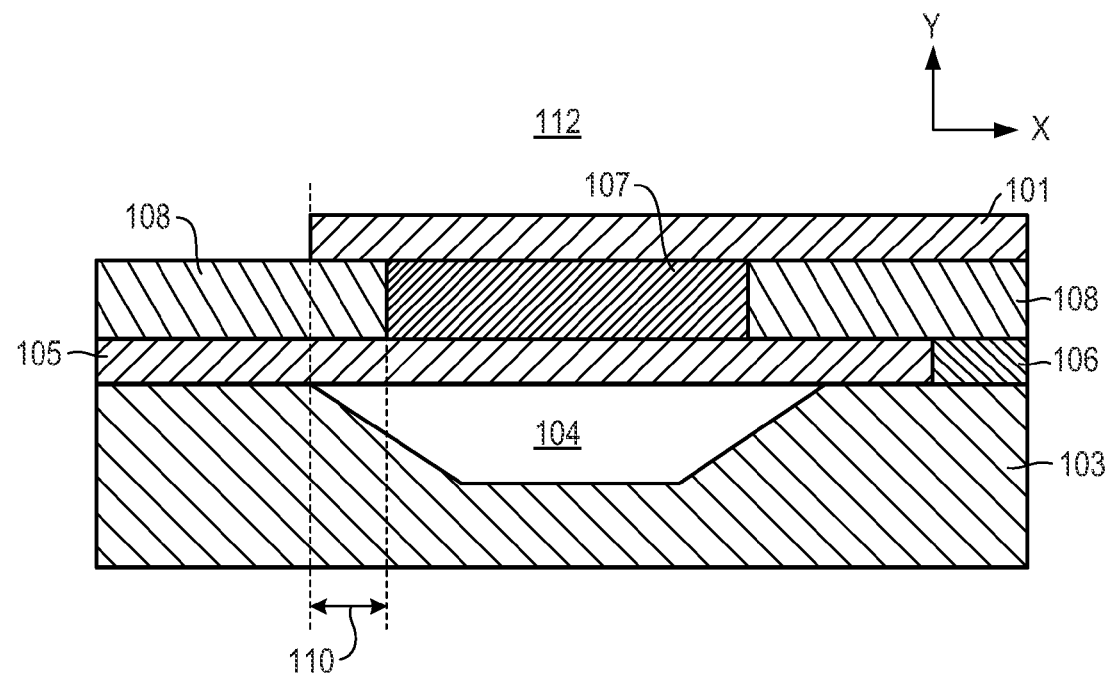

FIG. 1C shows a cross-sectional view of FBAR 112 in accordance with a representative embodiment. Many aspects of the FBAR 112 and its methods of fabrication are common to those of FBAR 100 and are not repeated. The FBAR 112 comprises piezoelectric layer 107 and np layer 108 adjacent thereto. Unlike FBAR 100 in which the np layer 108 is adjacent to piezoelectric layer 107 on two sides (i.e., is a ring of non-piezoelectric material in a piezoelectric material), the np layer 108 of FBAR 112 is substantially continuous and is not surrounded by piezoelectric layer 107. Notably, the FBAR 100 and the FBAR 112 are substantially operationally the same, provided that the interactions between np layer 108 and the edge 111 of the second electrode 101 are optimized for improved Q. However, one advantage of the structure of the FBAR 112 relates to fabrication of multiple FBARs to form a filter, for example. Notably, forming np layer 108 of finite width in FBAR 100 can increase the separation between FBARs of the filter and thus can increase the filter size and overall cost. On the other hand, creation of np layer 108 in FBAR 112 can cause processing issues with subsequent layers (e.g. de-lamination of the second electrode 101). As such, it may be beneficial to minimize the overall area of np layer 108 as in FBAR 100.

In the illustrative embodiments described above, the np layer 108 is provided along all sides of FBAR 108 and FBAR 112 (i.e., all sides of the illustrative five-sided FBAR 100, 112). It is noted that this is not essential, and in other embodiments the np layer 108 is not disposed on all sides (e.g., the np layer 108 may be disposed on four of five sides).

Figure 1D:
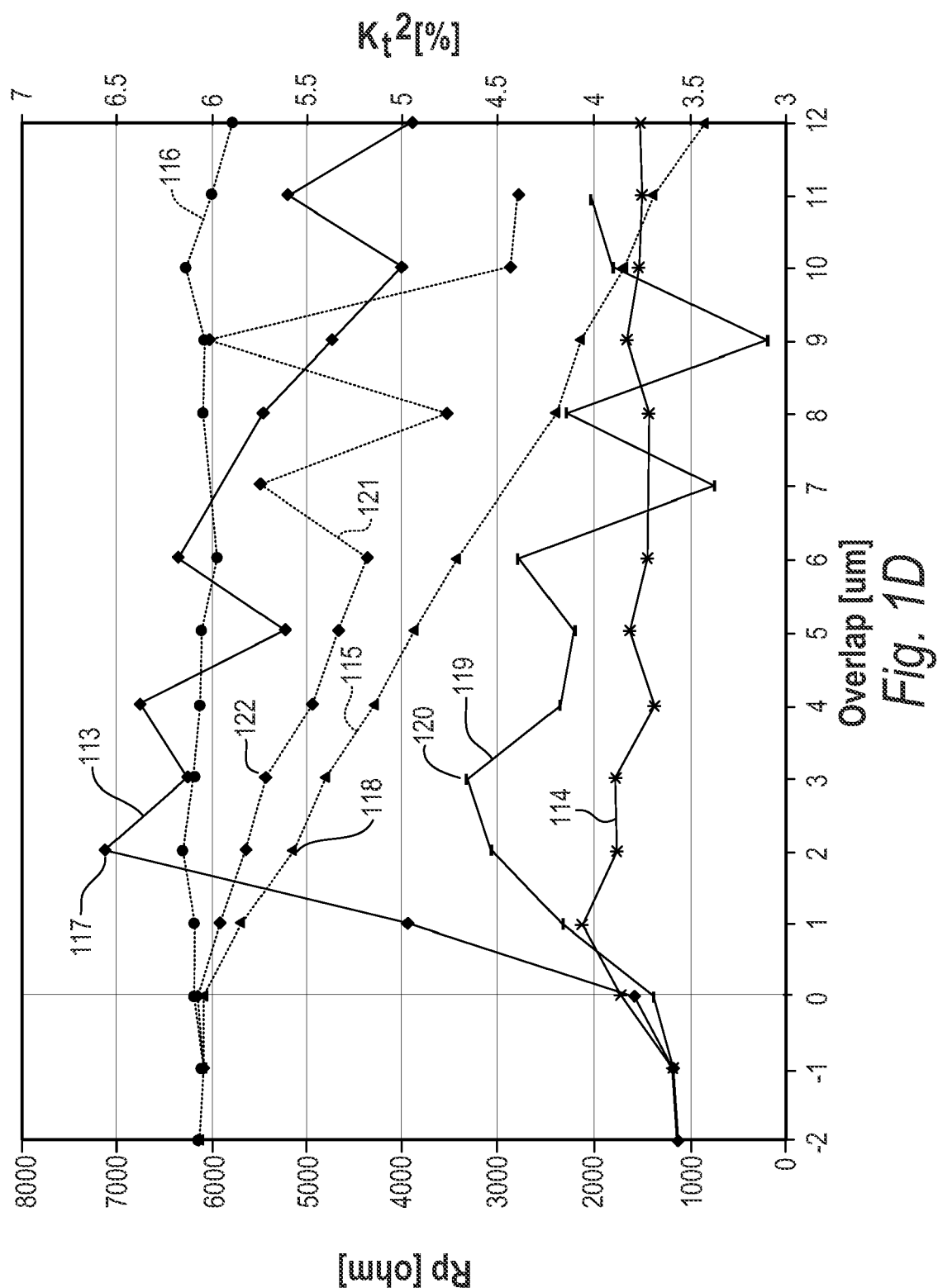
FIG. 1D is a graph showing the parallel impedance (Rp) (left axis) and the electro-mechanical coupling coefficient ($kt^2$) (right axis) versus width of an overlap of an electrode and a non-piezoelectric layer of an FBAR in accordance with a representative embodiment.

FIG. 1D is a graphical representation of the parallel impedance ($R_p$) (left axis—Ohms) and electro-mechanical coupling coefficient ($k_t^2$) (right axis—%) versus width (μm) of the overlap 110 of the second electrode 101 and the np layer 108 for an FBAR of a representative embodiment. Curve 113 depicts $R_p$ versus overlap 110 in which $e_{33np}$ is 0.01 $e_{33p}$. Curve 114 depicts $R_p$ versus overlap 110 in which $e_{33np}$ is equal to $e_{33p}$ (i.e., no np layer 108 is provided) and serves as a baseline for comparison of $R_p$. Curve 115 depicts $k_t^2$ versus overlap 110 in which $e_{33np}$ in which $e_{33np}$ is 0.01 $e_{33p}$. Curve 116 depicts $k_t^2$ versus overlap 110 when $e_{33np}$ is equal to $e_{33p}$ (i.e., no np layer 108 is provided) and serves as a baseline for comparison of $k_t^2$. When the width of the overlap 110 is approximately 2.0 μm, $R_p$ reaches a maximum value (point 117 of curve 113) of approximately 7000. The quality factor (Q) evaluated at parallel resonance frequency ($F_P$) increases from approximately 700 for a known FBAR (i.e., without np layer 108) to approximately 3500 for an FBAR of a representative embodiment with overlap 110 of 2.0 μm. With overlap 110 of approximately 2.0 μm $k_t^2$ is approximately 5.3% (point 118), which is a reduction of approximately 0.6% compared to the baseline level depicted in curve 116. Notably, overlap 110 of 2.0 μm is approximately equal to λ/2 of the first order propagating eigenmode in the np layer 108. The subsequent maxima in $R_P$ for overlap 110 of approximately 4.0 μm and overlap 110 of approximately 6.0 μm appear to correspond to integer multiples (1, 2, 3 . . . ) of λ/2 for the first propagating eigenmode. It should be emphasized again that due to complexity of the diffraction phenomena involved in piston mode formation in FBAR 100 simple prediction of most optimum width of np layer 108 is usually not possible and has to be done numerically, and, ultimately, experimentally.

Curve 119 depicts $R_p$ versus overlap 110 in which $e_{33np}$ is 0.5$e_{33p}$. The parallel impedance $R_p$ of the FBAR 100 comprising np layer 108 is increased compared to the baseline of curve 114 to a maximum of approximately 3500 Ohms at point 120 with overlap 110 of approximately 3.0 μm. Notably, lower values of $R_p$ depicted in curve 119 as compared to curve 113 are caused by the fact that there is substantial excitation of both continuous and propagating modes in np layer 108 for a case in which $e_{33np}$ is 0.5$e_{33p}$. Therefore, there is more scattering of actively excited modes at the edge 111 of the second electrode 101, resulting in lower $R_p$. Also, the peak $R_p$ occurs with overlap 110 of approximately 3.0 μm wide overlap 110, which most likely results from a different diffraction pattern in np layer 108.

Curve 121 depicts the electro-mechanical coupling coefficient $k_t^2$ versus overlap 110 in which $e_{33np}$ in which $e_{33np}$ is 0.5 $e_{33p}$. For overlap of approximately 3.0 $k_t^2$ is approximately 5.5%. It is noted that a reduction of $k_t^2$ in the in FBAR 100 with np layer 108 is expected due to suppressed electrical excitation of mechanical motion in the np layer 108. By definition $k_t^2$ is a measure of degree of overlap of electric field (confined between the first electrode 105 and the second electrode 101) and the mechanical motion excited by the electric field. In FBAR 100, the electric field between both electrodes is present, but excitation of mechanical motion is suppressed due to the np layer 108. Beneficially, this results in the desired increase in $R_p$, but because the degree of overlap of the electric field and the mechanical motion is diminished, $k_t^2$ is reduced. The larger the suppression of electrical excitation of mechanical motion (larger $R_p$), the larger the resulting degradation in $k_t^2$ that is expected. As can be appreciated from a review of $k_t^2$ versus piezoelectric coupling coefficient ($e_{33np}$) in FIG. 1D, $k_t^2$ decreases with decreased $e_{33np}$ of np layer 108.

As can be appreciated FBAR 100 comprising np layer 108 provides an increase in the parallel impedance $R_p$ and an improvement in Q compared to an FBAR without an np layer. Notably, in one embodiment, $R_p$ is increased by approximately 6000 ohms with an acceptable reduction in $k_t^2$ (0.5%).

Embodiments Comprising a Double Bulk Acoustic Resonator (DBAR)

Figure 2A:
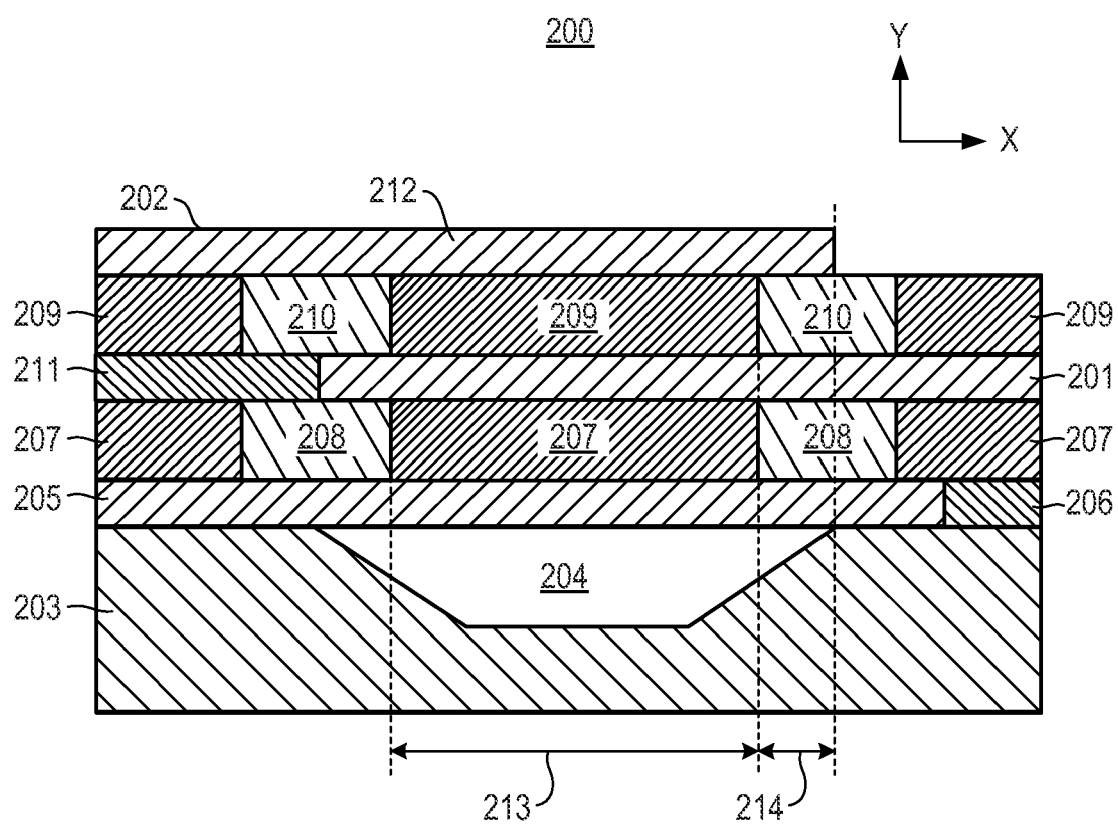
FIGS. 2A-2C are cross-sectional views of a double bulk acoustic resonator (DBAR) in accordance with representative embodiments.
Figure 2B:
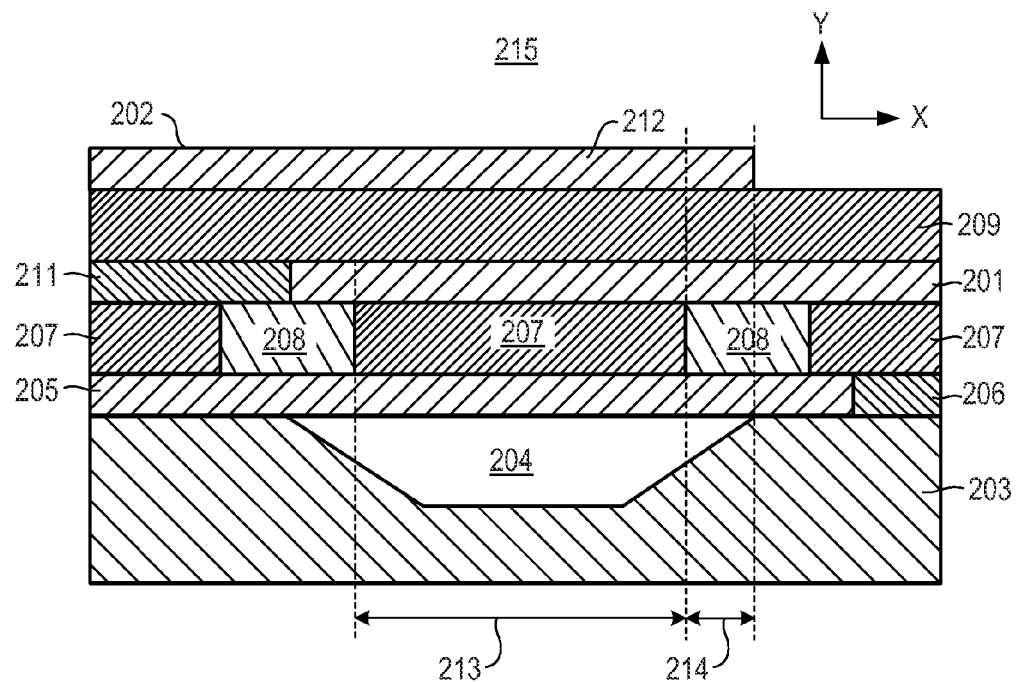
Figure 2C:
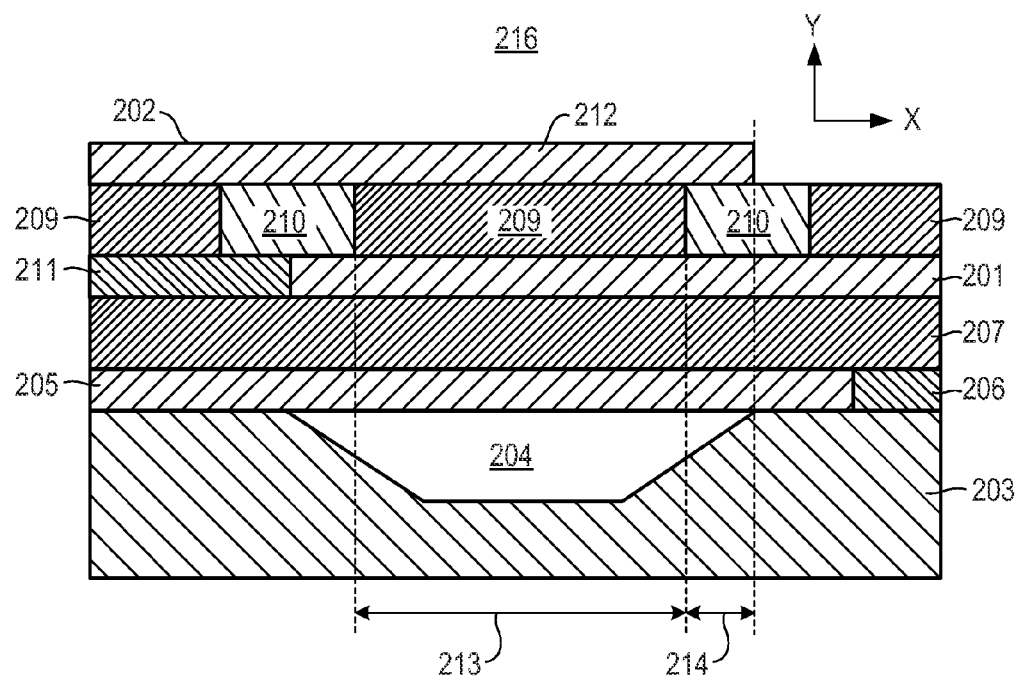

FIGS. 2A~2C are cross-sectional views of a double bulk acoustic resonator (DBAR) in accordance with representative embodiments. Many details of the present embodiments are common to those described above in connection with the representative embodiments of FIGS. 1A-1C. Generally, the common details are not repeated in the description of embodiments comprising a DBAR.

FIG. 2A is a cross-sectional view of a DBAR 200 in accordance with a representative embodiment. A substrate 203 comprises a cavity 204 or other acoustic reflector (e.g., a distributed Bragg grating (DBR) (not shown)). A first electrode 205 is disposed over the substrate 203 and is suspended over the cavity 204. A first planarization layer 206 is provided over the substrate 203 and may be non-etchable borosilicate glass (NEBSG) In general, first planarization layer 206 does not need to be present in the structure (as it increases overall processing cost), but when present, it may serve to improve the quality of growth of subsequent layers (e.g., highly textured c-axis piezoelectric material) and simplify their processing. A first piezoelectric layer 207 is provided over the first electrode 205, and comprises highly-textured c-axis piezoelectric material such as aluminum nitride (AlN) or zinc oxide (ZnO). Adjacent to the first piezoelectric layer 207 is first non-piezoelectric (np) layer 208. The first np layer 208 is typically made from the same substance as the first piezoelectric layer 207 (e.g., AlN or ZnO) but is either amorphous or polycrystalline and exhibits little or no piezoelectric effects. The second electrode 201 is disposed over the first piezoelectric layer 207 and over the first np layer 208.

A second piezoelectric layer 209 is disposed over the second electrode 201. Adjacent to the second piezoelectric layer is a second np layer 210. The second np layer 210 is typically made from the same substance as the second piezoelectric layer 209 (e.g., AlN or ZnO), and like the first np layer 108 is either amorphous or polycrystalline and exhibits little or no piezoelectric effects. A second planarization layer 211 is provided over the first piezoelectric layer 207 and the first np layer 208 as depicted. Like the first planarization layer 206, the second planarization layer 211 is illustratively non-etchable borosilicate glass (NEBSG), and does not need to be present in the structure (as it increases overall processing cost). However, the second planarization layer may serve to improve the quality of growth of subsequent layers (e.g., highly textured c-axis piezoelectric material) and simplify their processing.

A third electrode 212 is disposed over the second piezoelectric layer 209, and the second np layer 210. On a connection side 202, the third electrode 212 extends over the second np layer 210, and on all other sides of the DBAR 200, the third electrode 212 overlaps the first and second np layers 208, 210 by a predetermined width described below.

The overlap of the cavity 204, the first electrode 205, the first piezoelectric layer 207, the second electrode 201, the second piezoelectric layer 209 and the third electrode 212 defines an active region 213 of the DBAR 200. In representative embodiments described below, acoustic losses at the boundaries of DBAR 200 are mitigated to improve mode confinement in the active region 213. In particular, the width of an overlap 214 of the second electrode 201 and the first and second np layers 208, 210 is selected to reduce acoustic losses to continuous modes or to a lowest order eigenmode in the np layer. As described more fully below, in one representative embodiment the width of the overlap 214 is selected to be either greater than or equal to the inverse of the attenuation constant (1/k) of the lowest order evanescent mode in the first and second np layers 208, 210 or an integer multiple (1, 2, 3, . . . ) of quarter-wavelength ($\lambda/4$) of the lowest order propagating eigenmode in the first and second np layers 208, 210. In general, the width of first and second np layers 208, 210 is selectively minimized in order to minimize the area of DBAR 200 and to minimize possible adverse effects of first and second np layers 208, 210 on DBAR 200 (e.g. de-lamination of layers disposed over either of first and second np layers 208, 210). It is noted that due to complexity of the diffraction phenomena involved in piston mode formation in DBAR 200, determination of an optimum width of the overlap 214 is generally determined experimentally.

In the embodiment depicted in FIG. 2A, the first np layer 208 is disposed between layers of the first piezoelectric layer 207, and the second np layer 210 is disposed between layers of the second piezoelectric layer 209. It is noted that the first np layer 208 may extend from the interface with the first piezoelectric layer 207 (i.e., at the edge of the active region 213) and the second np layer 210 may extend from the interface with the second piezoelectric layer 209 (i.e., at the edge of the active region 213). As such, the first piezoelectric layer 207 and the second piezoelectric layer 209 are provided only in the active region 213.

FIG. 2B is a cross-sectional view of a DBAR 215 in accordance with a representative embodiment. The substrate 203 comprises cavity 204 or other acoustic reflector (e.g., a distributed Bragg grating (DBR) (not shown)). The first electrode 205 is disposed over the substrate 203 and is suspended over the cavity 204. The first planarization layer 206 is provided over the substrate 203 and may be non-etchable borosilicate glass (NEBSG). The first piezoelectric layer 207 is provided over the first electrode 205, and comprises highly-textured c-axis piezoelectric material such as aluminum nitride (AlN) or zinc oxide (ZnO). Adjacent to the first piezoelectric layer 207 is the first non-piezoelectric (np) layer 208. The first np layer 208 is typically made from the same substance as the first piezoelectric layer 207 (e.g., AlN or ZnO) but is either amorphous or polycrystalline and exhibits little or no piezoelectric effects.

The second electrode 201 is disposed over the first piezoelectric layer 207 and over the first np layer 208.

The second piezoelectric layer 209 is disposed over the second electrode 201. Unlike the embodiment depicted in FIG. 2A, there is no a second np layer 210 in the DBAR 215. The third electrode 212 is disposed over the second piezoelectric layer 209. On a connection side 202, the third electrode 212 extends over the second piezoelectric layer 209. On all other sides of the DBAR 215, the third electrode 212 overlaps the first np layer 208 by a predetermined width described below.

The overlap of the cavity 204, the first electrode 205, the first piezoelectric layer 207, the second electrode 201, the second piezoelectric layer 209 and the third electrode 212 defines an active region 213 of the DBAR 215. In representative embodiments described below, acoustic losses at the boundaries of DBAR 215 are mitigated to improve mode confinement in the active region 213. In particular, the width of the overlap 214 of the second electrode 201 and the first np layer 208 is selected to reduce acoustic losses to continuous modes or to a lowest order eigenmode in the np layer. As described more fully below, in one representative embodiment the width of the overlap 214 is selected to be either greater than or equal to the inverse of the attenuation constant (1/k) of the lowest order evanescent eigenmode in the first np layer 208 or an integer multiple (1, 2, 3, . . . ) of quarter-wavelength ($\lambda/4$) of the lowest order propagating eigenmode in the first np layer 208. It is noted that due to complexity of the diffraction phenomena involved in piston mode formation in DBAR 215, determination of an optimum width of the overlap 214 is generally determined experimentally.

In the embodiment depicted in FIG. 2B, the first np layer 208 is disposed between layers of the first piezoelectric layer 207. It is noted that the first np layer 208 may extend from the interface with the first piezoelectric layer 207 (i.e., at the edge of the active region 213). As such, the first piezoelectric layer 207 is provided only in the active region 213.

FIG. 2C is a cross-sectional view of a DBAR 216 in accordance with a representative embodiment. The substrate 203 comprises cavity 204 or other acoustic reflector (e.g., a distributed Bragg grating (DBR) (not shown)). The first electrode 205 is disposed over the substrate 203 and is suspended over the cavity 204. The first planarization layer 206 is provided over the substrate 203 and may be non-etchable borosilicate glass (NEBSG). The first piezoelectric layer 207 is provided over the first electrode 205, and comprises highly-textured c-axis piezoelectric material such as aluminum nitride (AlN) or zinc oxide (ZnO). Unlike the embodiment depicted in FIGS. 2A and 2B, in the DBAR 216 there is no np layer disposed adjacent to the first piezoelectric layer 207.

The second piezoelectric layer 209 is disposed over the second electrode 201. The third electrode 212 is disposed over the second piezoelectric layer 209. Second np layer 210 is disposed adjacent to second piezoelectric layer 209. On a connection side 202, the third electrode 212 extends over the second piezoelectric layer 209. On all other sides of the DBAR 215, the third electrode 212 overlaps the first np layer 208 by a predetermined width described below.

The overlap of the cavity 204, the first electrode 205, the first piezoelectric layer 207, the second electrode 201, the second piezoelectric layer 209 and the third electrode 212 defines the active region 213 of the DBAR 216. In representative embodiments described below, acoustic losses at the boundaries of DBAR 216 are mitigated to improve mode confinement in the active region 213. In particular, the width of the overlap 214 of the second electrode 201 and the second np layer 210 is selected to reduce acoustic losses to continuous modes or to a lowest order propagating eigenmode in the second np layer 210. As described more fully below, in one representative embodiment the width of the overlap 214 is selected to be greater than or equal to the inverse of the attenuation constant (1/k) of the lowest order evanescent mode in the np layer 210, or an integer multiple (1, 2, 3, ... ) of quarter-wavelength ($\lambda/4$) of the lowest order propagating eigenmode in the np layer 210. It is noted that due to complexity of the diffraction phenomena involved in piston mode formation in DBAR 216, determination of an optimum width of the overlap 214 is generally determined experimentally In the embodiment depicted in FIG. 2C, the second np layer 210 is disposed between layers of the second piezoelectric layer 209. It is noted that the second np layer 210 may extend from the interface with the second piezoelectric layer 209 (i.e., at the edge of the active region 213). As such, the second piezoelectric layer 209 is provided only in the active region 213.

In the representative embodiments described above, the first and second np layers 208, 210 are substantially aligned and have substantially identical width (x-direction). It is emphasized that the first and second np layers are not necessarily aligned, or are not of substantially identical width, or both. It is also emphasized that in the illustrative embodiments described above, the np layers 208, 210 are provided along all sides of DBAR 200, DBAR 215 and DBAR 216 (i.e., sides of the illustrative five-sided DBAR 200, 215, 216). It is noted that this is not essential, and in other embodiments the np layers 208, 210 are not disposed on all sides (e.g., each of first or second np layers 208, 210 may be disposed along the same or along different four of five sides).

Figure 2D:
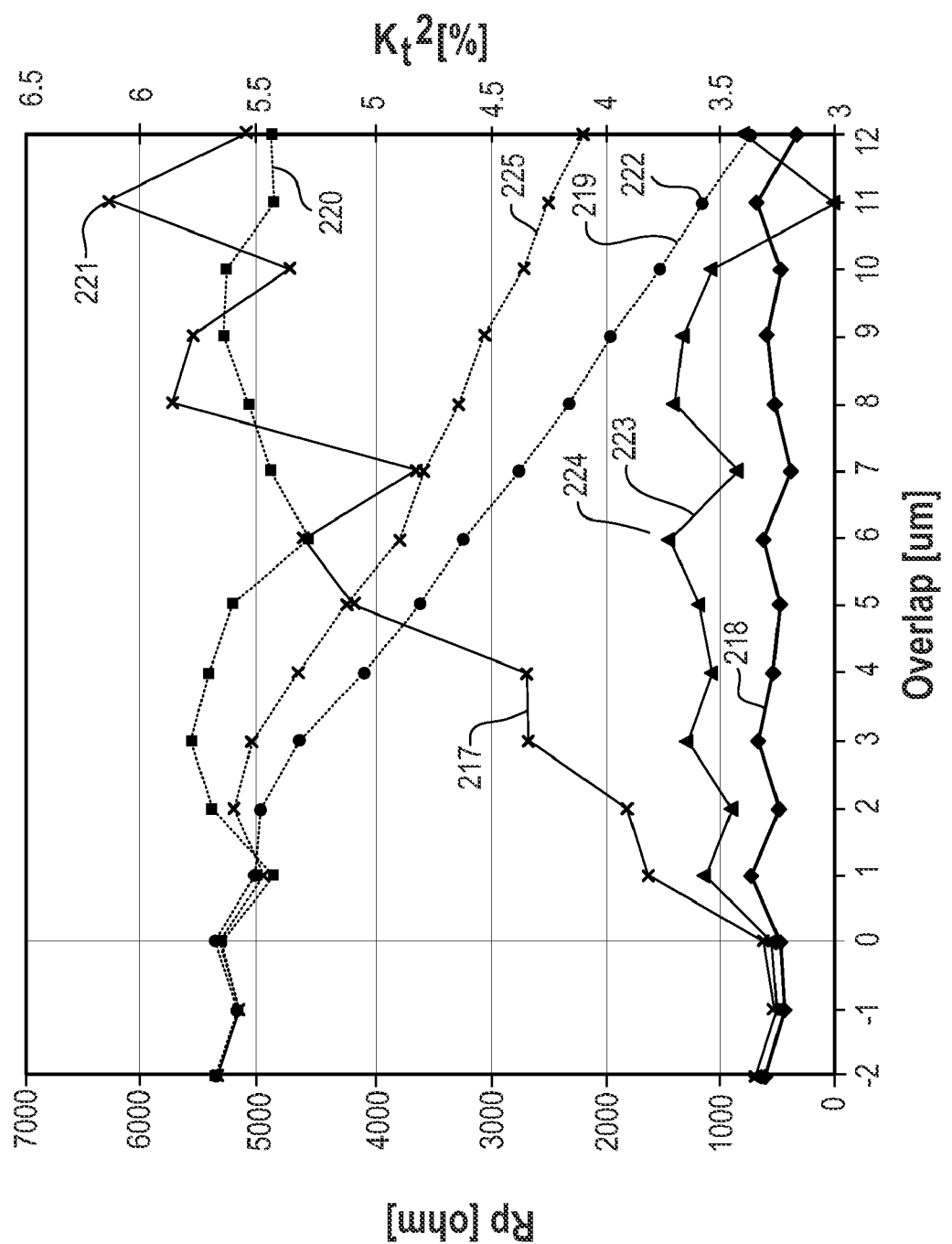
FIG. 2D is a graph showing the parallel impedance (Rp) (left axis) and the electro-mechanical coupling coefficient ($kt^2$) (right axis) versus width of an overlap of an electrode and a non-piezoelectric layer of a DBAR in accordance with a representative embodiment.

FIG. 2D is a graphical representation of the parallel impedance ($R_p$) (left axis—Ohms) and electro-mechanical coupling coefficient ($k_t^2$) (right axis—%) versus width ($\mu$m) of the overlap 214 of DBAR 200 depicted in FIG. 2A. Curve 217 depicts $R_p$ versus overlap 110 in which $e_{33np}$ is 0.01 $e_{33p}$. Curve 218 depicts $R_p$ versus overlap 214 in which $e_{33np}$ is equal to $e_{33p}$ (i.e., first and second np layers 208, 210 are not provided) and serves as a baseline for comparison of $R_p$. Curve 219 depicts $k_t^2$ versus overlap 214 in which $e_{33np}$ in which $e_{33np}$ is 0.01 $e_{33p}$. Curve 220 depicts $k_t^2$ versus overlap 214 when $e_{33np}$ is equal to $e_{33p}$ (i.e., first and second np layers 208, 210 are not provided) and serves as a baseline for comparison of $k_t^2$. When the width of the overlap 214 is approximately 11.0 $\mu$m, $R_p$ reaches a maximum value (point 221 of curve 217) of approximately 6500 ohms. Improvement of quality factor Q at parallel resonance $F_p$ of approximately 10 times is expected in DBAR 200 as compared known DBAR without np layers 208 and 210. With overlap 214 of approximately 11.0 $\mu$m $k_t^2$ is approximately 3.5% (point 222). While such low $k_t^2$ precludes DBAR 200 from being used in frequency bands requiring large filter bandwidth, there are specific frequency bands (e.g. Band 13) that require resonators having $k_t^2$ in the range of approximately 3% to approximately 4%. Moreover, and as should be appreciated by one of ordinary skill in the art, for low frequency bands (e.g. around 700 MHz) the area required for a known BAW-based filter is comparatively large. By the present teachings the overall area need for filters at lower frequency bands can be reduced by incorporating DBAR 200 rather than known FBARs or other BAW resonators. For such frequency band applications with low bandwidth requirements, reduction of $k_t^2$ with simultaneous significant increase of $R_p$ in DBAR 200 is beneficial from the perspective of cost and performance.

In FIG. 2D, at point 221 overlap 214 for maximum $R_p$ is approximately equal to 11.0 $\mu$m. This overlap 214 is equal to or greater than the inverse of the attenuation constant (1/k) of a first evanescent mode in first and second np layers 208, 210. This is in contrast to the result shown by point 117 in FIG. 1D for FBAR 100, where the maximum $R_p$ design appears to be determined by half-wavelength ($\lambda/2$) width of the first propagating eigenmode in np layer 108. However, DBAR 200 can be viewed as comprising of two strongly coupled FBARs. Thus the number of allowed propagating modes in DBAR is approximately two times larger than in a corresponding FBAR. It is expected that while diffraction of the lowest order propagating mode leads to its suppression in np layers 208 and 210 for a specific overlap 214 (thus suppression of scattering losses at the edges of the second and third electrodes 201 and 212), the diffraction of the higher order propagating mode leads to its enhancement in np layers 208 and 210 for the same overlap 214. As such, enhancement of scattering losses at the edges of the second and third electrodes 201 and 212 for higher order propagating eigenmodes may be expected. These two effects may average out and therefore the next dominant effect yielding increase of $R_p$ is the minimization of scattering of the lowest order evanescent mode.

Curve 223 depicts $R_p$ versus overlap 214 in which $e_{33np}$ is 0.5$e_{33p}$. The parallel impedance $R_p$ of the DBAR 200 comprising first and second np layers 208, 210 is increased compared to the baseline of curve 218 to a maximum at point 224 with overlap 214 of approximately 6.0 $\mu$m. Curve 225 depicts $k_t^2$ versus overlap 214 in which $e_{33np}$ in which $e_{33np}$ is 0.5 $e_{33p}$. For overlap of approximately 6.0 $\mu$m, $k_t^2$ is approximately 4.5%. Overall these results are consistent with the analogous results shown in FIG. 1D for FBAR 100 comprising np layer 108 indicating that in general the underlying mechanisms determining parallel impedance $R_p$ and electromechanical coupling coefficients $k_t^2$ in both FBAR 100 and DBAR 200 are similar and won't be repeated here for brevity of the presentation.

Embodiments Comprising a Coupled Resonator Filter (CRF)

Figure 3A:
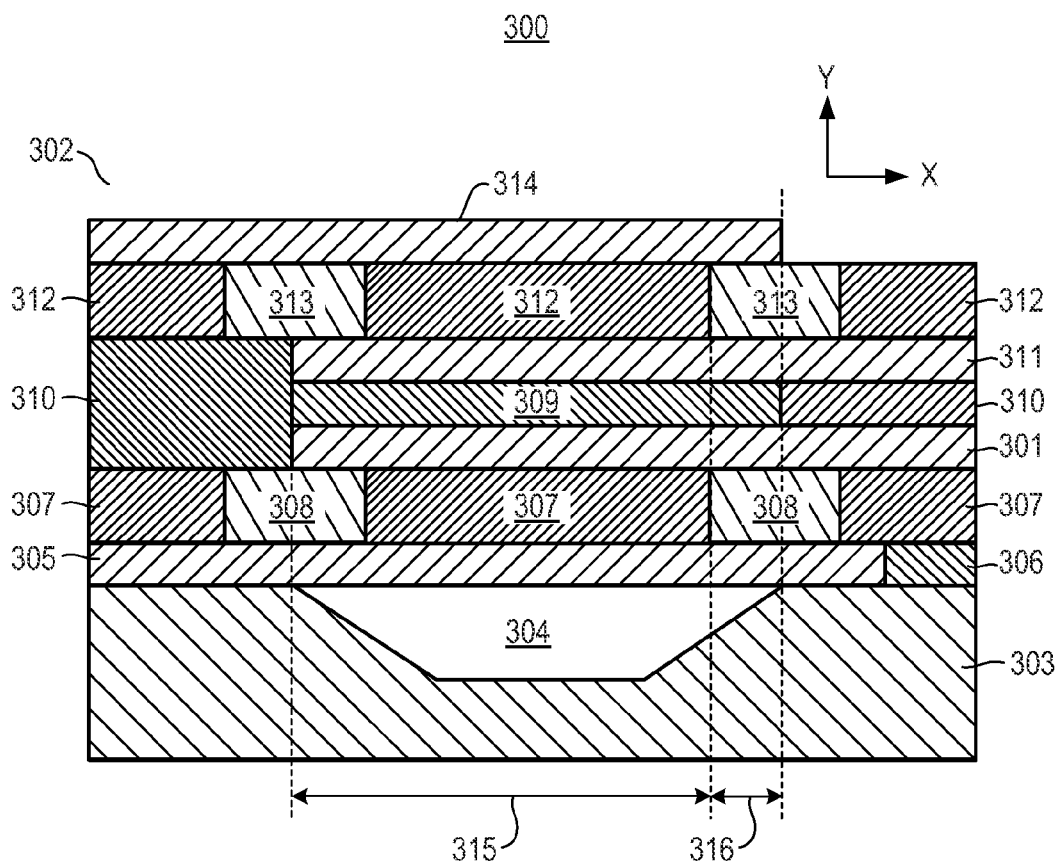
FIGS. 3A-3C are cross-sectional views of coupled resonator filters (CRFs) in accordance with representative embodiments.
Figure 3B:
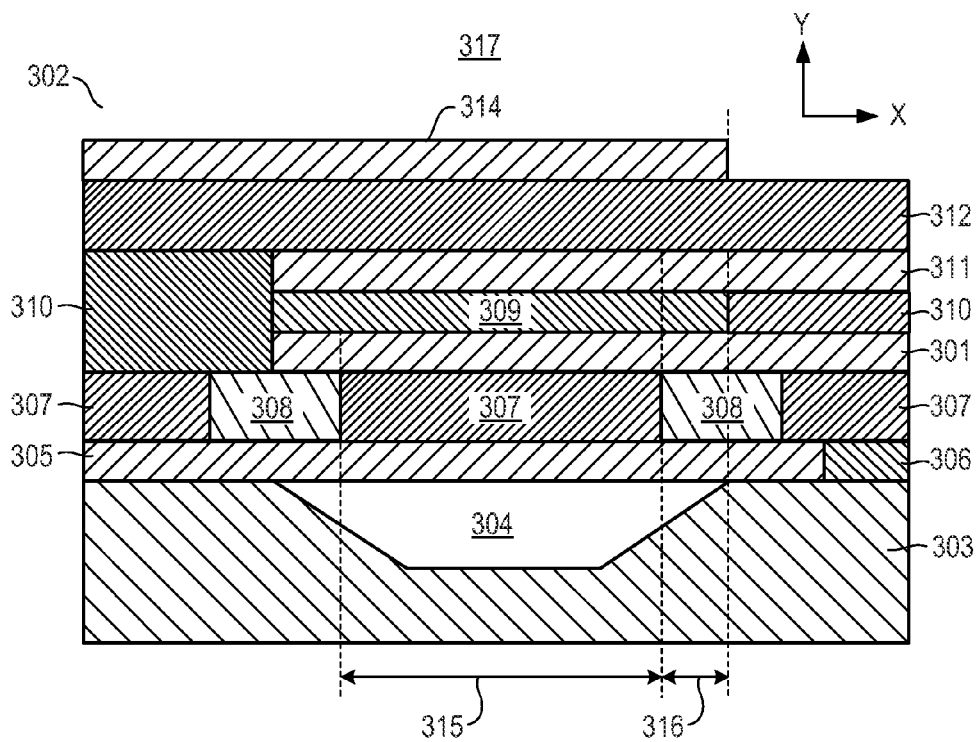
Figure 3C:
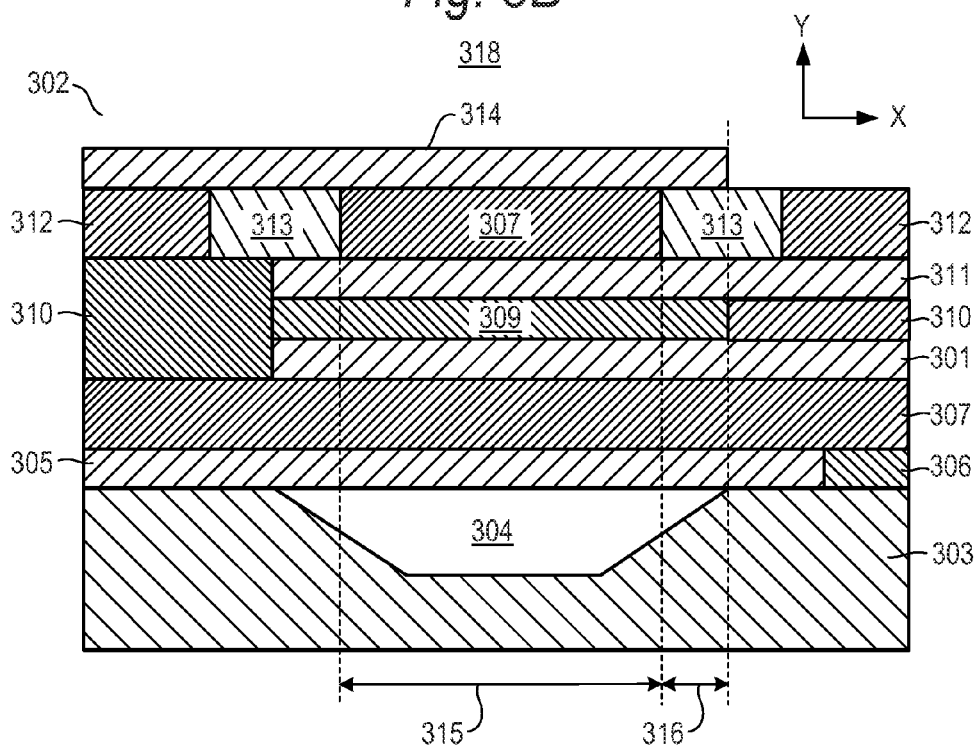

FIGS. 3A-3C are cross-sectional views of a coupled resonator filter (CRF) in accordance with representative embodiments. Many details of the present embodiments are common to those described above in connection with the representative embodiments of FIGS. 1A-2C. Generally, the common details are not repeated in the description of embodiments comprising a CRF.

FIG. 3A is a cross-sectional view of a CRF 300 in accordance with a representative embodiment. A substrate 303 comprises a cavity 304 or other acoustic reflector (e.g., a distributed Bragg grating (DBR) (not shown)). A first electrode 305 is disposed over the substrate 203 and is suspended over the cavity 204. A first planarization layer 306 is provided over the substrate 303 and may be non-etchable borosilicate glass (NEBSG) In general, first planarization layer 306 does not need to be present in the structure (as it increases overall processing cost), but when present, it may serve to improve the quality of growth of subsequent layers (e.g., highly textured c-axis piezoelectric material) and simplify their processing. A first piezoelectric layer 307 is provided over the first electrode 305, and comprises highly-textured c-axis piezoelectric material such as aluminum nitride (AlN) or zinc oxide (ZnO). Adjacent to the first piezoelectric layer 307 is first non-piezoelectric (np) layer 308. The first np layer 308 is typically made from the same substance as the first piezoelectric layer 307 (e.g., AlN or ZnO) but is either amorphous or polycrystalline and exhibits little or no piezoelectric effects. A second electrode 201 is disposed over the first piezoelectric layer 307 and over the first np layer 308.

An acoustic coupling layer ("coupling layer") 309 is disposed over the second electrode 301, and a second planarization layer 310. The coupling layer comprises carbon doped oxide (CDO), or NEBSG, or carbon-doped silicon oxide (SiOCH) such as described in commonly owned U.S. patent application Ser. No. 12/710,640, entitled "Bulk Acoustic Resonator Structures Comprising a Single Material Acoustic Coupling Layer Comprising Inhomogeneous Acoustic Property" to Elbrecht, et al. and filed on Feb. 23, 2010. The disclosure of this patent application is specifically incorporated herein by reference. Notably, SiOCH films of the representative embodiment belong to a general class of comparatively low dielectric constant (low-k) dielectric materials often referred to as carbon-doped oxide (CDO). Alternatively, the coupling layer 309 may comprise other dielectric materials with suitable acoustic impedance and acoustic attenuation, including, but not limited to porous silicon oxynitride (SiON); porous boron doped silicate glass (BSG); or porous phosphosilicate glass (PSG). Generally, the material used for the coupling layer 112 is selected to provide comparatively low acoustic impedance and loss in order to provide desired pass-band characteristics.

A third electrode 311 is disposed over the coupling layer 309 and the second planarization layer 310 as depicted in FIG. 3A. The second planarization layer 310 is illustratively non-etchable borosilicate glass (NEBSG), and does not need to be present in the structure (as it increases overall processing cost). However, the second planarization layer 310 may serve to improve the quality of growth of subsequent layers (e.g., highly textured c-axis piezoelectric material) and simplify their processing.

A second piezoelectric layer 312 is disposed over the third electrode 311. Adjacent to the second piezoelectric layer 312 is a second np layer 313. The second np layer 313 is typically made from the same substance as the second piezoelectric layer 312 (e.g., AlN or ZnO), and like the first np layer 308 is either amorphous or polycrystalline and exhibits little or no piezoelectric effects.

A fourth electrode 314 is disposed over the second piezoelectric layer 312, and the second np layer 313. On a connection side 302, the fourth electrode 314 extends over the second np layer 313. On all other sides of the CRF 300, the fourth electrode 314 overlaps the first and second np layers 308, 313 by a predetermined width described below.

The overlap of the cavity 304, the first electrode 305, the first piezoelectric layer 307, the second electrode 301, the coupling layer 309, the third electrode 311, the second piezoelectric layer 312 and the fourth electrode 314 defines an active region 315 of the CRF 300. In representative embodiments described below, acoustic losses at the boundaries of CRF 300 are mitigated to improve mode confinement in the active region 315. In particular, the width of an overlap 316 of the fourth electrode 314 and the first and second np layers 308, 313 is selected to reduce acoustic losses to continuous modes or to a lowest order eigenmode in the np layer. As described more fully below, in one representative embodiment the width of the overlap 316 is selected to be greater than or equal to the inverse of the attenuation constant (1/k) of the lowest order evanescent eigenmode in the first and second np layers 308, 313 or an integer multiple (1, 2, 3, . . . ) of quarter-wavelength (λ/4) of the lowest order propagating eigenmode in the first and second np layers 308, 313. It is noted that due to complexity of the diffraction phenomena involved in piston mode formation in CRF 300, determination of an optimum width of the overlap 316 is generally determined experimentally.

It should be emphasized that due to complexity of the diffraction phenomena involved in piston mode formation in CRF 300, simple prediction of most optimum width of np layer 108 is usually not possible and has to be done numerically, and, ultimately, experimentally In the embodiment depicted in FIG. 3A, the first np layer 308 is disposed between layers of the first piezoelectric layer 307, and the second np layer 313 is disposed between layers of the second piezoelectric layer 312. It is noted that the first np layer 308 may extend from the interface with the first piezoelectric layer 307 (i.e., at the edge of the active region 315) and the second np layer 313 may extend from the interface with the second piezoelectric layer 312 (i.e., at the edge of the active region 315). As such, the first piezoelectric layer 307 and the second piezoelectric layer 312 are provided only in the active region 315.

FIG. 3B is a cross-sectional view of a CRF 317 in accordance with a representative embodiment. The substrate 303 comprises cavity 304 or other acoustic reflector (e.g., a distributed Bragg grating (DBR) (not shown)). The first electrode 305 is disposed over the substrate 303 and is suspended over the cavity 304. A first planarization layer 306 is provided over the substrate 303 and may be non-etchable borosilicate glass (NEBSG) In general, first planarization layer 306 does not need to be present in the structure (as it increases overall processing cost), but when present, it may serve to improve the quality of growth of subsequent layers (e.g., highly textured c-axis piezoelectric material) and simplify their processing.

The first piezoelectric layer 307 is provided over the first electrode 305, and comprises highly-textured c-axis piezoelectric material such as aluminum nitride (AlN) or zinc oxide (ZnO). Adjacent to the first piezoelectric layer 307 is first non-piezoelectric (np) layer 308. The first np layer 308 is typically made from the same substance as the first piezoelectric layer 307 (e.g., AlN or ZnO) but is either amorphous or polycrystalline and exhibits little or no piezoelectric effects. A second electrode 201 is disposed over the first piezoelectric layer 307 and over the first np layer 308.

The acoustic coupling layer ("coupling layer") 309 is disposed over the second electrode 301, and the second planarization layer 310. The third electrode 311 is disposed over the coupling layer 309 and the second planarization layer 310 as depicted in FIG. 3A. The second planarization layer 310 is illustratively non-etchable borosilicate glass (NEBSG), and does not need to be present in the structure (as it increases overall processing cost). However, the second planarization layer 310 may serve to improve the quality of growth of subsequent layers (e.g., highly textured c-axis piezoelectric material) and simplify their processing.

The second piezoelectric layer 312 is disposed over the third electrode 311. Unlike CRF 300 in which the second np layer 313 is adjacent to the second piezoelectric layer 312 on two sides (i.e., is a ring of non-piezoelectric material in a piezoelectric material), the second np layer 313 is foregone.

The fourth electrode 314 is disposed over the second piezoelectric layer 312. On a connection side 302, the fourth electrode 314 extends over the second piezoelectric layer 312. On all other sides of the CRF 300 the fourth electrode 314 overlaps the first np layer 308 by a predetermined width described below.

The overlap of the cavity 304, the first electrode 305, the first piezoelectric layer 307, the second electrode 301, the coupling layer 309, the third electrode 311, the second piezoelectric layer 312 and the fourth electrode 314 defines the active region 315 of the CRF 317. In representative embodiments described below, acoustic losses at the boundaries of CRF 317 are mitigated to improve mode confinement in the active region 315. In particular, the width of an overlap 316 of the fourth electrode 314 and the first and second np layers 308, 313 is selected to reduce acoustic losses to continuous modes or to a lowest order eigenmode in the np layer. As described more fully below, in one representative embodiment the width of the overlap 316 is selected to be greater than or equal to the inverse of the attenuation constant (1/k) of the lowest order evanescent eigenmode, or an integer multiple (1, 2, 3, . . . ) of quarter-wavelength ($\lambda/4$) of the lowest order propagating eigenmode in the first np layer 308. It is noted that due to complexity of the diffraction phenomena involved in piston mode formation in CRF 317, determination of an optimum width of the overlap 316 is generally determined experimentally.

In the embodiment depicted in FIG. 3B, the first np layer 308 is disposed between layers of the first piezoelectric layer 307. It is noted that the first np layer 308 may extend from the interface with the first piezoelectric layer 307 (i.e., at the edge of the active region 315). As such, the first piezoelectric layer 307 is provided only in the active region 315.

FIG. 3C is a cross-sectional view of a CRF 318 in accordance with a representative embodiment. The substrate 303 comprises cavity 304 or other acoustic reflector (e.g., a distributed Bragg grating (DBR) (not shown)). The first electrode 305 is disposed over the substrate 303 and is suspended over the cavity 304. A first planarization layer 306 is provided over the substrate 303 and may be non-etchable borosilicate glass (NEBSG). In general, first planarization layer 306 does not need to be present in the structure (as it increases overall processing cost), but when present, it may serve to improve the quality of growth of subsequent layers (e.g., highly textured c-axis piezoelectric material) and simplify their processing.

The first piezoelectric layer 307 is provided over the first electrode 305, and comprises highly-textured c-axis piezoelectric material such as aluminum nitride (AlN) or zinc oxide (ZnO). Unlike CRF 300 in which the first np layer 308 is adjacent to the first piezoelectric layer 307 on two sides (i.e., is a ring of non-piezoelectric material in a piezoelectric material), the first np layer 308 is foregone. Second electrode 301 is disposed over the first piezoelectric layer 307.

The acoustic coupling layer ("coupling layer") 309 is disposed over the second electrode 301, and the second planarization layer 310. The third electrode 311 is disposed over the coupling layer 309 and the second planarization layer 310 as depicted in FIG. 3C. The second planarization layer 310 is illustratively non-etchable borosilicate glass (NEBSG), and does not need to be present in the structure (as it increases overall processing cost). However, the second planarization layer 310 may serve to improve the quality of growth of subsequent layers (e.g., highly textured c-axis piezoelectric material) and simplify their processing.

The second piezoelectric layer 312 is disposed over the third electrode 311. The fourth electrode 314 is disposed over the second piezoelectric layer 312. On a connection side 302, the fourth electrode 314 extends over the second piezoelectric layer 312. On all other sides of the CRF 318 the fourth electrode 314 overlaps the first np layer 308 by a predetermined width described below.

The overlap of the cavity 304, the first electrode 305, the first piezoelectric layer 307, the second electrode 301, the coupling layer 309, the third electrode 311, the second piezoelectric layer 312 and the fourth electrode 314 defines the active region 315 of the CRF 318. In representative embodiments described below, acoustic losses at the boundaries of CRF 318 are mitigated to improve mode confinement in the active region 315. In particular, the width of an overlap 316 of the fourth electrode 314 and the second np layer 313 is selected to reduce acoustic losses to continuous modes or to a lowest order eigenmode in the np layer. As described more fully below, in one representative embodiment the width of the overlap 316 is selected to be greater than or equal to the inverse of the attenuation constant (1/k) of the lowest order evanescent eigenmode, or an integer multiple (1, 2, 3 . . . ) quarter wavelength ($\lambda/4$) of the lowest order propagating eigenmode in the np layer 313. It is noted that due to complexity of the diffraction phenomena involved in piston mode formation in CRF 300, determination of an optimum width of the overlap 316 is generally determined experimentally.

In the embodiment depicted in FIG. 3C, the second np layer 313 is disposed between layers of the second piezoelectric layer 312. It is noted that the second np layer 313 may extend from the interface with the second piezoelectric layer 312 (i.e., at the edge of the active region 315). As such, the second piezoelectric layer 312 is provided only in the active region 315.

In the representative embodiments described above, the first and second np layers 308, 313 are substantially aligned and have substantially identical width (x-direction). It is emphasized that the first and second np layers are not necessarily aligned, or are not of substantially identical width, or both. It is also emphasized that in the illustrative embodiments described above, the first and second np layers 308, 313 are provided along all sides of CRF 300, CRF 317 and CRF 318 (i.e., sides of the illustrative five-sided CRF 300, 317, 318). It is noted that this is not essential, and in other embodiments the first and second np layers 308, 313 are not disposed on all sides (e.g., each first and second np layers 308, 313 may be disposed along the same four of five sides or along different four of five sides).

Figure 3D:
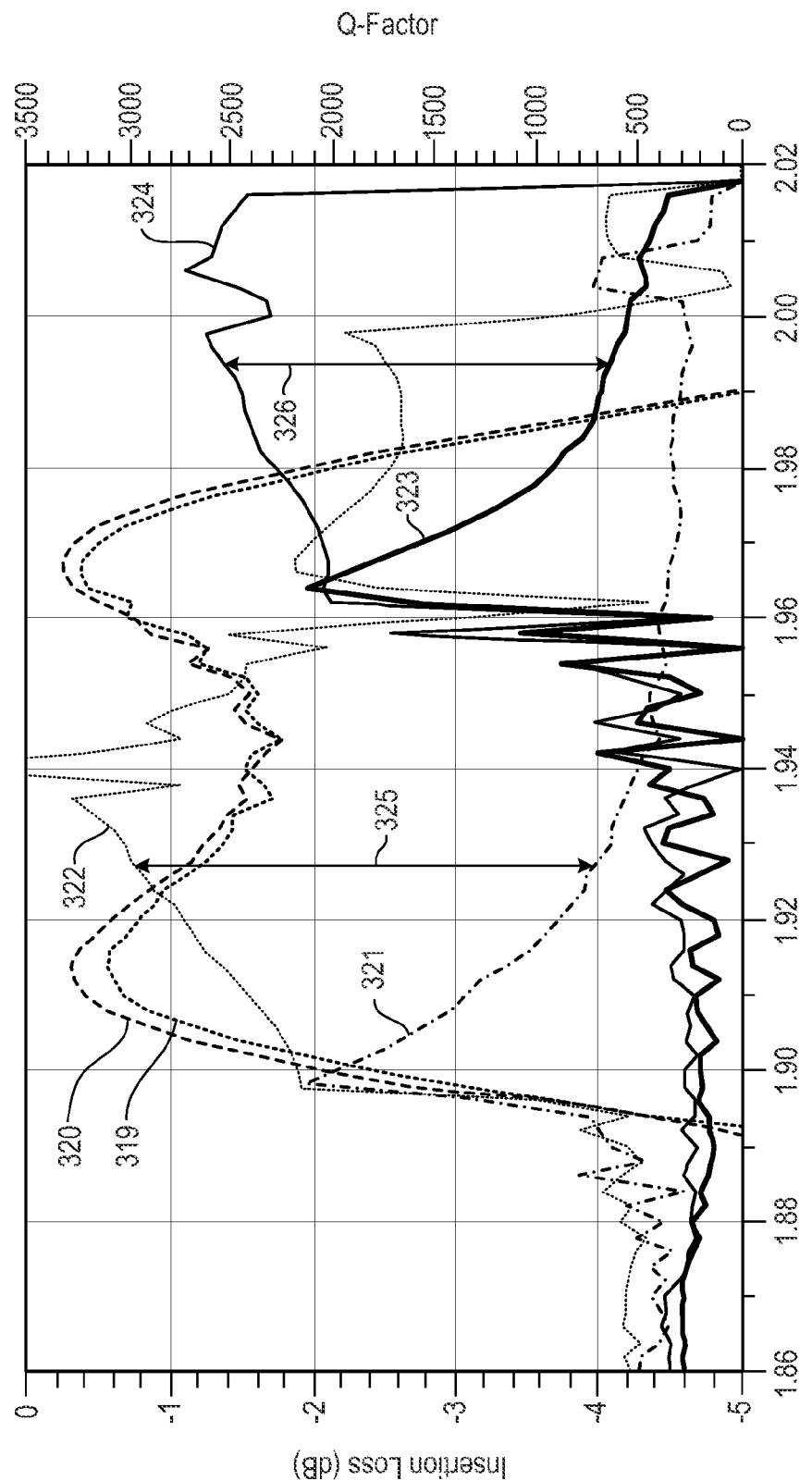
FIG. 3D is a graph of an insertion loss IL (left axis) and Q factor (right axis) of an odd mode ($Q_o$) and even mode ($Q_e$) of a known CRF and a CRF in accordance with a representative embodiment.

FIG. 3D is a graphical representation of the insertion loss ($S_{21}$) (left axis—dB) and quality factor for odd (Qo) and even (Qe) order modes (right axis) versus frequency (GHz) for the CRF 300 depicted in FIG. 3A. The illustrative results correspond to the best simulated case for which the overlap 316 between first and second np layers 308, 313 and edges of second, third and fourth electrodes 301, 311 and 314 is set to 2 μm. Note that the optimal overlap for the CRF 300 is substantially the same as optimal overlap 110 for FBAR 100.

Curve 319 depicts the insertion loss for a CRF in which $e_{33np}$ is equal to $e_{33p}$ (i.e., first and second np layers 308, 313 are not provided) and serves as a baseline for comparison of $S_{21}$. Curve 320 depicts the insertion loss for the CRF 300. As can be appreciated, a significant improvement in the insertion loss is realized by reduction of acoustic losses in the CRF 300 compared to a known CRF without first and second np layers 308, 313.

Curve 321 depicts Qo for a known CRF in which $e_{33np}$ is equal to $e_{33p}$ (i.e., first and second np layers 308, 313 are not provided) and serves as a baseline for comparison of Qo. Curve 322 depicts Qo for CRF 300. As can be appreciated, a significant improvement in Qo is realized by reduction of acoustic losses in the CRF 300 compared to a known CRF without first and second np layers 308, 313. Depending on frequency (e.g. at 1.93 GHz) increase of Qo from approximately 500 to approximately 3000 is predicted for CRF 300 as compared to a known CRF without first and second np layers 308, 313.

Curve 323 depicts Qe for a known CRF in which $e_{33np}$ is equal to $e_{33p}$ (i.e., first and second np layers 308, 313 are not provided) and serves as a baseline for comparison of Qe. Curve 324 depicts Qe for CRF 300. The improvement in Qo (represented as 325) and Qe (represented as 326) at higher frequencies is readily apparent. Depending on the frequency (e.g. at 1.99 GHz), an increase of Qe from approximately 500 to approximately 2500 is predicted for CRF 300 as compared to a known CRF without first and second np layers 308, 313.

In accordance with illustrative embodiments, BAW resonator structures comprising a non-piezoelectric layer and their methods of fabrication are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator structure, comprising:
    a first electrode disposed over a substrate;
    a piezoelectric layer disposed over the first electrode;
    a second electrode disposed over the first piezoelectric layer, wherein c-axis orientations of crystals of the piezoelectric layer are substantially aligned with one another; and
    a non-piezoelectric layer disposed over the first electrode and adjacent to the piezoelectric layer, wherein an overlap of the non-piezoelectric layer with the second electrode has a width substantially equal to an integer multiple of one-quarter wavelength of a first propagating eigenmode in the non-piezoelectric layer, or greater than or equal to an inverse of an attenuation constant (1/k) of a first evanescent eigenmode in the non-piezoelectric layer.

2. A BAW resonator structure as claimed in claim 1, wherein the non-piezoelectric layer is polycrystalline.

3. A BAW resonator structure as claimed in claim 1, wherein the piezoelectric layer comprises a material, and the non-piezoelectric layer is a non-crystalline form of the material.

4. A BAW resonator structure as claimed in claim 3, wherein the material is aluminum nitride.

5. A BAW resonator structure as claimed in claim 1, further comprising an acoustic reflector disposed beneath the first electrode.

6. A BAW resonator structure as claimed in claim 5, wherein the acoustic reflector comprises a cavity.

7. A BAW resonator structure as claimed in claim 1, wherein the piezoelectric layer has a piezoelectric coupling coefficient ($e_{33}$) and the non-piezoelectric layer has a piezoelectric coupling coefficient that is less or equal to 80% of the first piezoelectric coupling coefficient.

8. A bulk acoustic wave (BAW) resonator structure, comprising:
    a first electrode disposed over a substrate;
    a first piezoelectric layer disposed over the first electrode;
    a second electrode disposed over the first piezoelectric layer, wherein c-axis orientations of crystals of the first piezoelectric layer are substantially aligned with one another;
    a second piezoelectric layer disposed over the second electrode;
    a non-piezoelectric layer; and
    a third electrode disposed over the second piezoelectric layer.

9. A BAW resonator structure as claimed in claim 8, wherein the non-piezoelectric layer has a width that is substantially equal to an integer multiple of one-quarter wavelength of a first propagating eigenmode in the non-piezoelectric layer, or greater than or equal to an inverse of an attenuation constant (1/k) of a first evanescent eigenmode in the non-piezoelectric layer.

10. A BAW resonator structure as claimed in claim 8, wherein the non-piezoelectric layer is disposed over the first electrode and adjacent to the first piezoelectric layer.

11. A BAW resonator structure as claimed in claim 8, wherein the non-piezoelectric layer is disposed over the second electrode and adjacent to the second piezoelectric layer.

12. A BAW resonator structure as claimed in claim 10, further comprising a second non-piezoelectric layer disposed over the second electrode and adjacent to the second piezoelectric layer.

13. A BAW resonator as claimed in claim 8, wherein the non-piezoelectric layer is polycrystalline.

14. A BAW resonator structure as claimed in claim 8, wherein the first piezoelectric layer comprises a material, and the non-piezoelectric layer is a non-crystalline form of the material.

15. A BAW resonator structure as claimed in claim 14, wherein the material is aluminum nitride.

16. A BAW resonator structure as claimed in claim 8, wherein the first piezoelectric layer has a first piezoelectric coupling coefficient ($e_{33}$) and the non-piezoelectric layer has a piezoelectric coupling coefficient that is less or equal to 80% the first piezoelectric coupling coefficient.

17. A BAW resonator structure as claimed in claim 12, wherein the second piezoelectric layer comprises a material, and the second non-piezoelectric layer is a non-crystalline form of the material.

18. A BAW resonator structure as claimed in claim 12, wherein the second piezoelectric layer has a second piezoelectric coupling coefficient ($e_{33}$) and the second non-piezoelectric layer has a piezoelectric coupling coefficient that is less or equal to 80% of the second piezoelectric coupling coefficient.

19. A BAW resonator structure as claimed in claim 8, further comprising: an acoustic coupling layer disposed between the second electrode and the second piezoelectric layer; and a fourth electrode disposed above the acoustic coupling layer and beneath the second piezoelectric layer.

* * * * *